(12) United States Patent
Akiba et al.

(10) Patent No.: US 8,142,669 B2
(45) Date of Patent: Mar. 27, 2012

(54) ELECTROMECHANICAL ELEMENT, ELECTRIC CIRCUIT DEVICE AND PRODUCTION METHOD OF THOSE

(75) Inventors: Akira Akiba, Kanagawa (JP); Shun Mitarai, Kanagawa (JP)

(73) Assignee: Sony Corporation, Tokyo (JP)

( * ) Notice: Subject to any disclaimer, the term of this patent is extended or adjusted under 35 U.S.C. 154(b) by 793 days.

(21) Appl. No.: 11/676,353

(22) Filed: Feb. 19, 2007

(65) Prior Publication Data

US 2008/0174204 A1 Jul. 24, 2008

(30) Foreign Application Priority Data

Feb. 20, 2006 (JP) ................ P2006-042987

(51) Int. Cl.
*H01L 21/302* (2006.01)
*B81C 1/00* (2006.01)

(52) U.S. Cl. ............. 216/2; 216/13; 216/17; 216/83; 438/52; 438/53; 438/745; 438/749

(58) Field of Classification Search ............ None
See application file for complete search history.

(56) References Cited

U.S. PATENT DOCUMENTS

| | | | | |
|---|---|---|---|---|
| 4,566,935 | A * | 1/1986 | Hornbeck | 438/29 |
| 6,162,657 | A * | 12/2000 | Schiele et al. | 438/52 |
| 6,346,735 | B1 * | 2/2002 | Ueyanagi et al. | 257/415 |
| 6,416,679 | B1 * | 7/2002 | Silverbrook | 216/27 |
| 6,478,974 | B1 * | 11/2002 | Lebouitz et al. | 216/2 |
| 6,713,235 | B1 * | 3/2004 | Ide et al. | 430/313 |
| 7,347,952 | B2 * | 3/2008 | Silverbrook | 216/27 |
| 7,429,495 | B2 * | 9/2008 | Wan | 438/53 |
| 7,562,429 | B2 * | 7/2009 | Larson et al. | 29/25.35 |
| 2006/0032811 | A1 * | 2/2006 | Shroff | 210/490 |

FOREIGN PATENT DOCUMENTS

JP 09-162462 6/1997

* cited by examiner

*Primary Examiner* — Anita Alanko
(74) *Attorney, Agent, or Firm* — SNR Denton US LLP

(57) ABSTRACT

An electromechanical element includes a mechanically movable element through a hollow formed on a substrate, and a plurality of holes formed in the movable element. In the electromechanical element, the plurality of holes are arranged such that at least two holes are in a same line, at least one hole is in another line located adjacent to the one line with at least two holes, and a distance between one of the holes arranged in the same line and the other hole located at the closest position from the one of the two holes arranged in the same line is longer than a distance between the holes adjacently arranged in the same line.

10 Claims, 16 Drawing Sheets

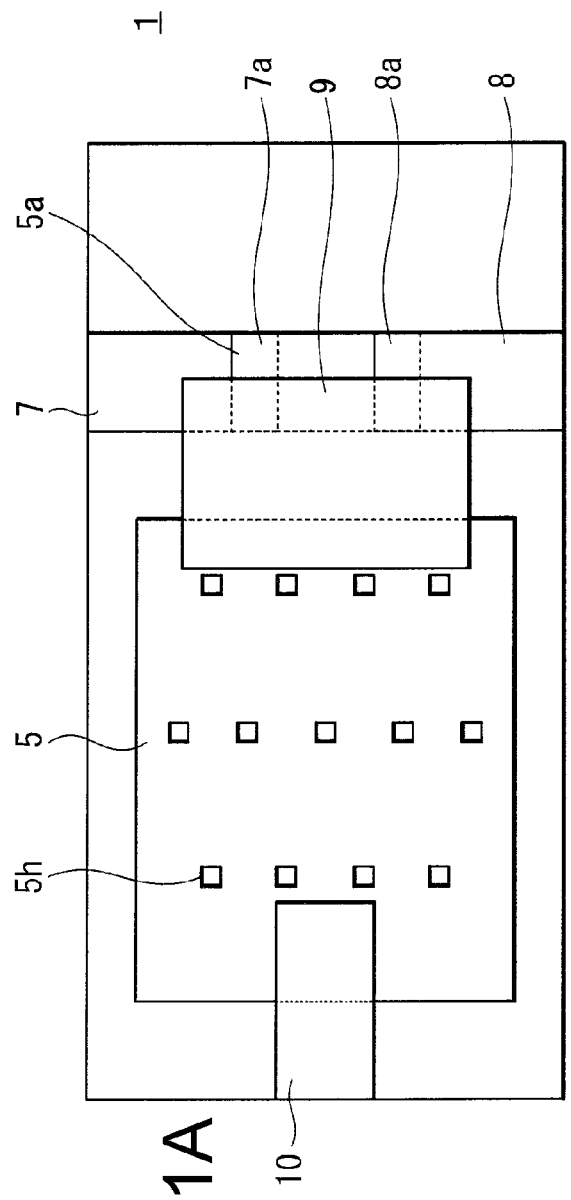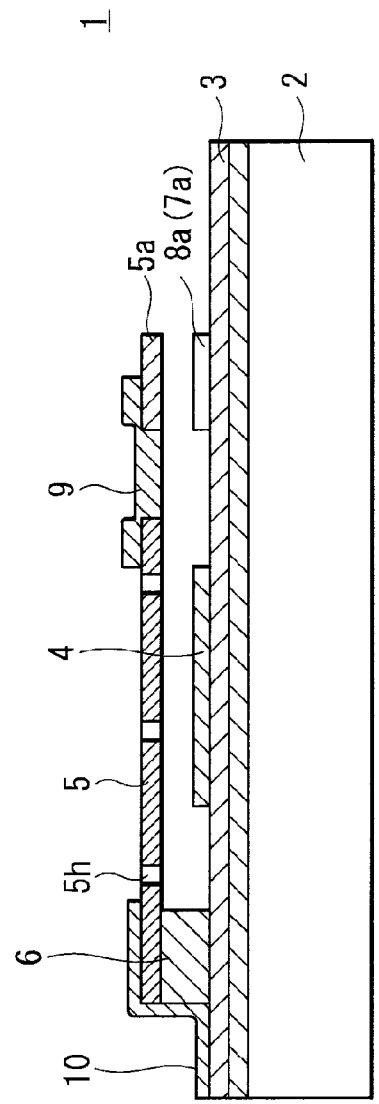
FIG. 1A
FIG. 1B

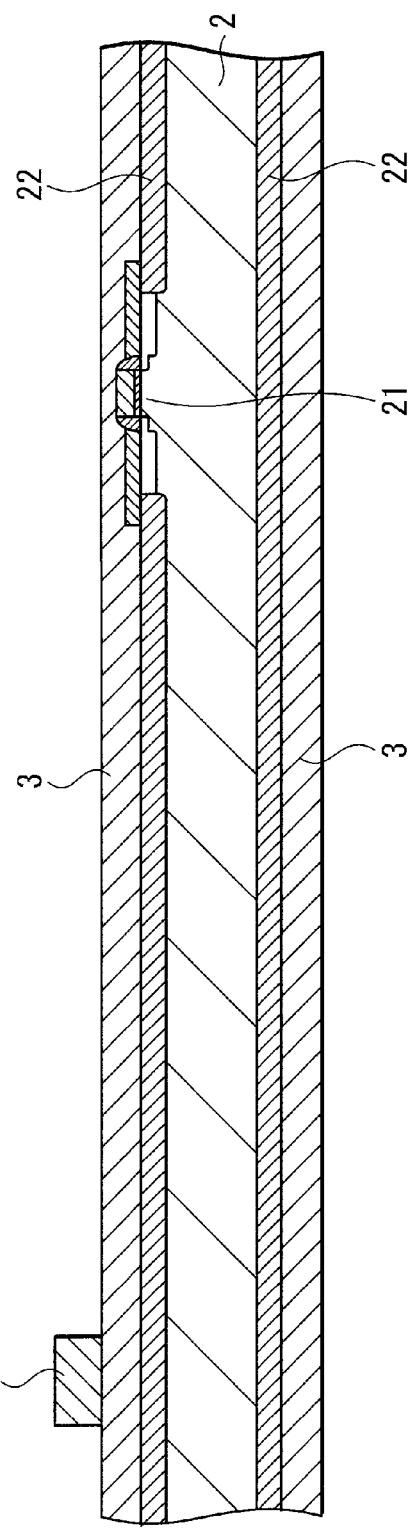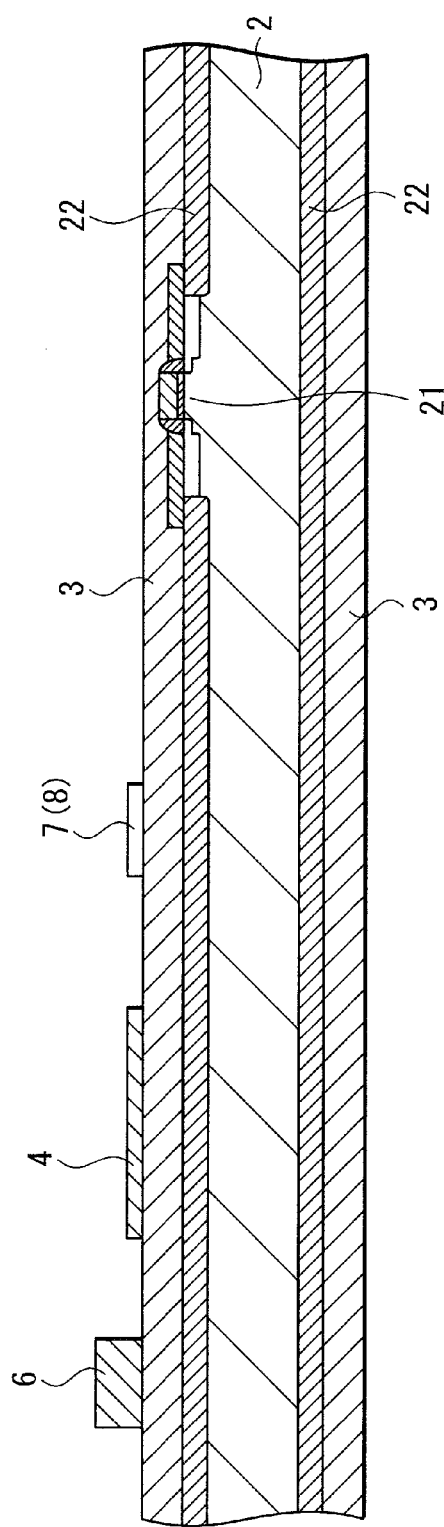

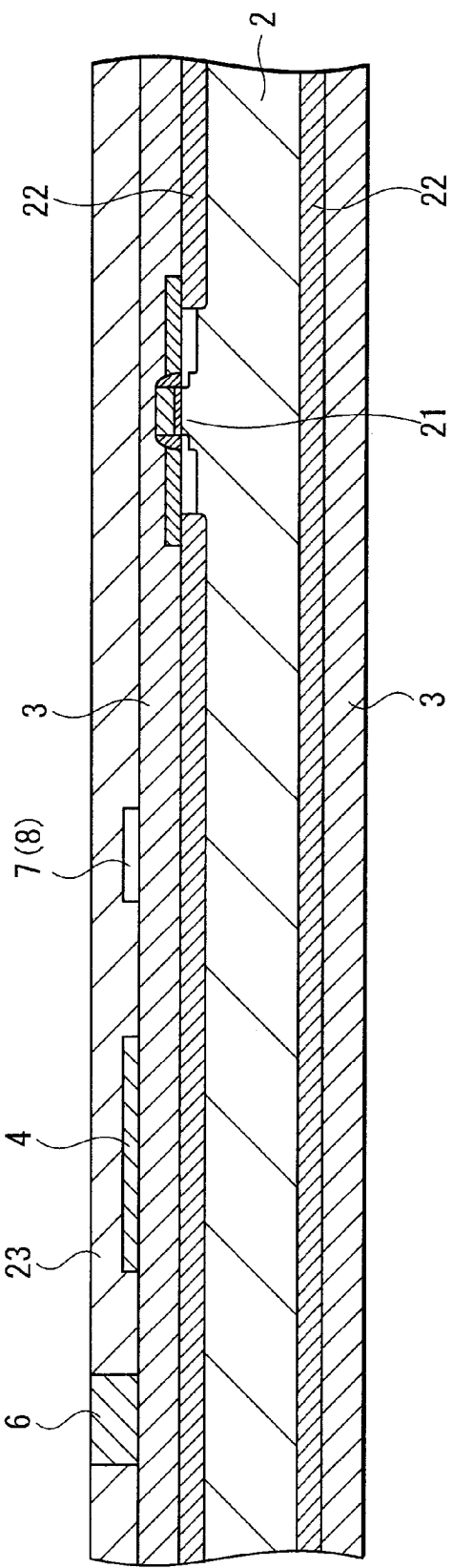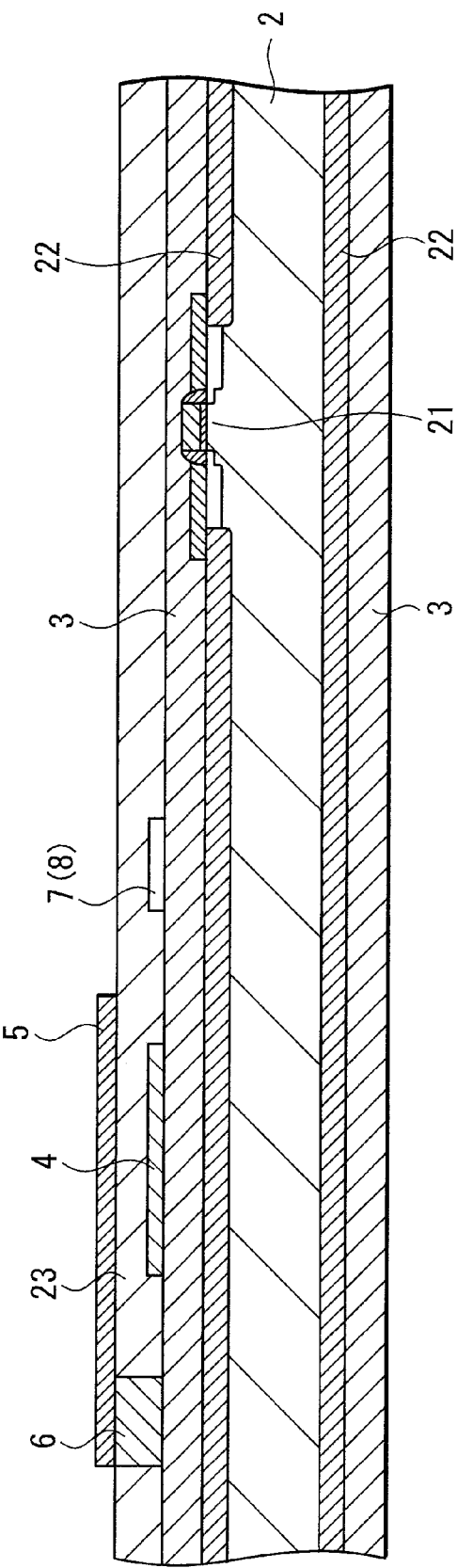

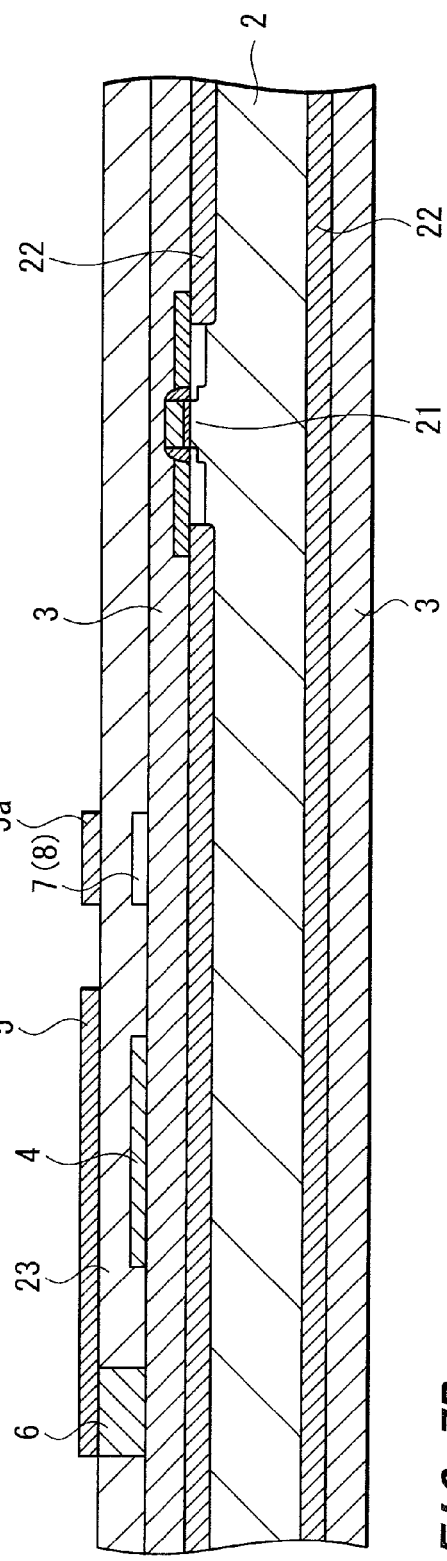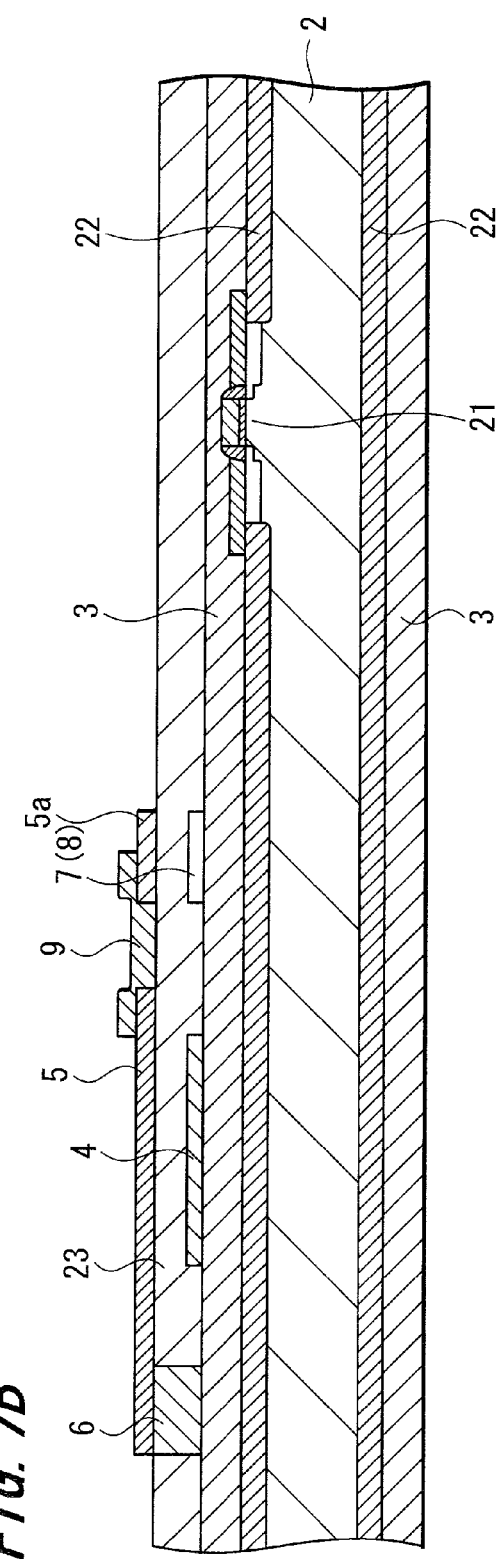

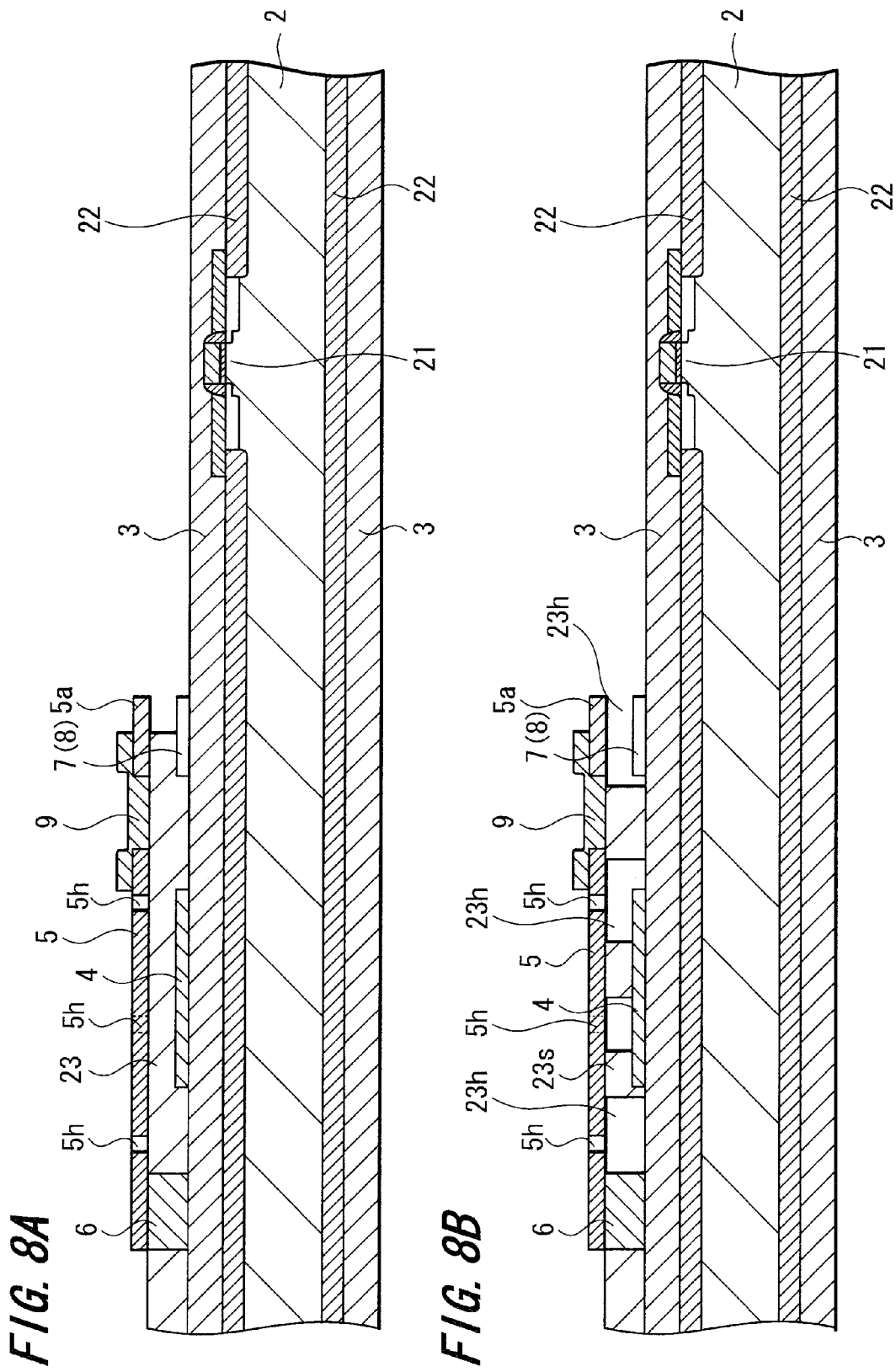

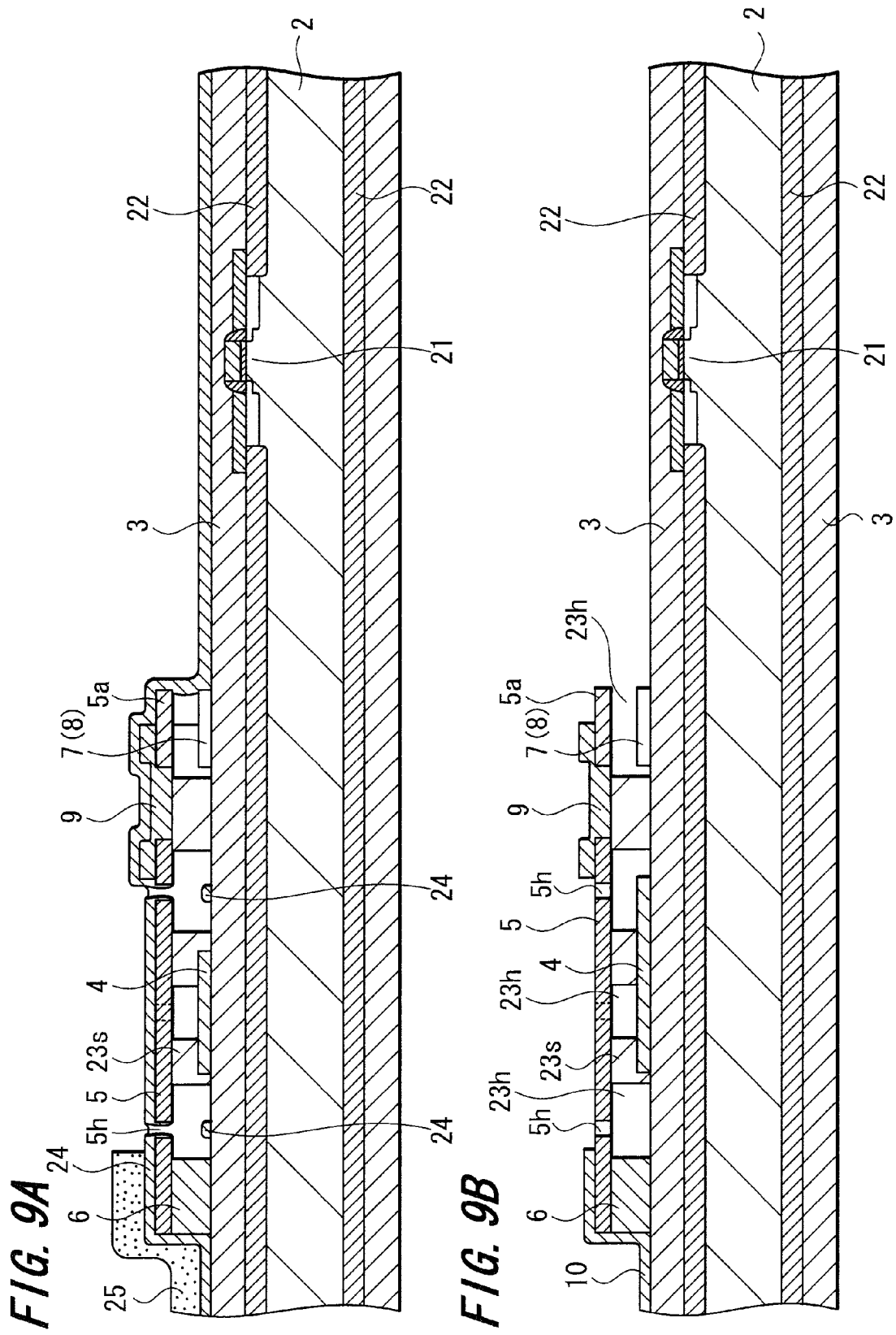

ELECTROMECHANICAL ELEMENT, ELECTRIC CIRCUIT DEVICE AND PRODUCTION METHOD OF THOSE

CROSS REFERENCES TO RELATED APPLICATIONS

The present invention contains subject manner related to Japanese Patent Application JP 2006-042987 filed in the Japanese Patent Office on Feb. 20, 2006, the entire contents of which being incorporated herein by reference.

BACKGROUND OF THE INVENTION

1. Field of the Invention

The present invention relates to an electromechanical element, an electric circuit device and a method of fabricating the electromechanical element and the electric circuit device.

2. Description of the Related Art

A micro electromechanical element, or MEMS (Micro Electro Mechanical System) is used as a single element for a switch, filter and capacitor or the like, or installed on a common semiconductor substrate with a circuit element of another semiconductor elements or the like to form various electric circuit devices (e.g., see patent publication: Japanese Unexamined patent publication H9-162462).

The MEMS includes a movable element, or an actuator that performs a mechanical vibration or a required mechanical operation of displacement or the like, and is driven by an electrostatic or electromagnetic force or combination of the electrostatic or electromagnetic force or the like. In such MEMS, specifically in surface MEMS, the movable element is usually formed on a sacrifice layer, and a hollowed portion is formed by removing the sacrifice layer located under a movable portion of the movable element, by etching from a circumference of movable portion in a lateral direction, where mechanical operations such as a vibration and displacement can be performed in the hollow.

However, when a perfect hollow is formed under the movable element, later conducting steps of forming electrode, cleaning, drying, inspection of warping and dicing, or the like can be performed on the movable element, mechanical load may be imposed on the movable element. This may cause deformation of or damage to the movable element, thereby resulting in decrease in reliability and production of defective products.

For example, an Al (aluminum) electrode is widely used for an electrode that feeds electricity to the movable element. However, the Al electrode is formed after removing the sacrifice layer by etching since the Al is corroded with a concentrated fluoric acid used as an etching solution for the sacrifice layer. However, forming the Al electrode on the movable element floating in a hollow can impose a comparatively large mechanical load on the movable element, for example, the Al formation of entire surface, an entire surface coating of photoresist for forming a pattern with a required shape, and patterning by photolithography. Such mechanical load on the movable element may cause deformation of or damage to the movable element, which may result in reduction in reliability or production of defective products. Specifically, in a case in which the movable element includes a large area, accurately etching the sacrifice layer that is located under the movable element can be difficult when etching from a circumference to the center of the movable element. Further, since etching may take a long time, etching after the formation of electrode mentioned above may impose some effects on the movable element.

SUMMARY OF THE INVENTION

According to an electromechanical element, an electric circuit device and a method of fabricating the electromechanical element and the electric circuit device of embodiments of the present invention, effects on a movable element formed by etching the sacrifice layer, electrodes, or the like in the electromechanical element can be reduced, and the sacrifice layer can reliably be removed. The electromechanical element, an electric circuit device and a method of fabricating the electromechanical element and the electric circuit device according to embodiments of the present invention, improvement in the reliability and reduction in the occurrence rate of defective products can also be realized.

According to an electromechanical element of an embodiment of the present invention, there is provided an electromechanical element that includes a mechanically movable element through a hollow formed on a substrate, and a plurality of holes formed in the movable element, in which the plurality of holes are arranged such that at least two holes are in a same line, at least one hole is in another line located adjacent to the one line with at least two holes, and a distance between one of the holes arranged in the same line and the other hole located at the closest position from the one of the two holes arranged in the same line is longer than a distance between the holes adjacently arranged in the same line.

An electric circuit device according to an embodiment of the present invention, there is provided an electric circuit device that includes a mechanically movable element through a hollow formed on a substrate, and a plurality of holes formed in the movable element through which a sacrifice layer is etched, in which the plurality of holes are arranged such that at least two holes are in a same line, at least one hole is in another line located adjacent to the one line with at least two holes, and a distance between one of the holes arranged in the same line and the other hole located at the closest position from the one of the two holes arranged in the same line is longer than a distance between the holes adjacently arranged in the same line.

According to an electromechanical element and an electric circuit device of embodiments of the present invention, since holes are formed in the movable element of the electromechanical element, not only can the sacrifice layer be etched from a circumference of the movable element, but the sacrifice layer can also be etched through the holes formed in the movable element. Further, since the holes are arranged in the movable element according to the above-described positional manner, pillar shaped or a wall shaped support portions for the movable element can be formed in the process of etching the sacrifice layer without forming any liquid pools.

According to a method of fabricating an electromechanical element of an embodiment of the present invention, there is provided a method of fabricating an electromechanical element including a mechanically movable element through a hollow formed on a substrate that includes the steps of:

forming a movable element through a sacrifice layer, penetrating to form a plurality of holes in the movable element through which the sacrifice layer is exposed, and performing at least a first etching and second etching on the sacrifice layer, in which the first etching includes etching the sacrifice layer from a circumference of the movable element and from limbs of the holes in the movable element to form support portions for the movable element using residual portions of the sacrifice layer that are not etched from the circumference of the movable element and from the limbs of the holes in the movable element, and the second etching includes removing the residual portions of the sacrifice layer located under the movable element such that the resultant sacrifice layer can be in a movable condition.

According to a method of fabricating an electric circuit device of an embodiment of the present invention, there is provided a method of fabricating an electric circuit device includes the steps of:

forming a movable element through a sacrifice layer, penetrating to form a plurality of holes in the movable element through which the sacrifice layer is exposed, and performing at least a first etching and second etching on the sacrifice layer, in which the holes in the movable element are arranged such that a distance between one of the holes arranged in the same line and the other hole located at the closest position from the one of the two holes arranged in the same line is longer than a distance between the holes adjacently arranged in the same line, the first etching includes etching the sacrifice layer from a circumference of the movable element and from limbs of the holes in the movable element to form support portions for the movable element in a pillar shape or a wall shape using residual portions of the sacrifice layer that are not etched from the circumference of the movable element and from the limbs of the holes in the movable element, and the second etching includes removing the residual portions of the sacrifice layer located under the movable element such that the resultant sacrifice layer can be in a movable condition.

According to a method of fabricating an electromechanical element and an electric circuit device of embodiments of the present invention, since holes or through-holes are preliminary formed in the movable element of the electromechanical element, the sacrifice layer can be etched from a circumference of the movable element, as well as etching through the holes formed in the movable element. As a result, the sacrifice layer, particularly the central portion of the sacrifice layer can effectively and reliably be removed by etching.

The etching may include at least two steps. A first etching includes a main etching step in which the sacrifice layer is efficiently removed using a high etch-rate etchant, and support portions for the movable element formed of the residual portions of the sacrifice layer is provided for reinforcing the movable element by selecting arrangement of the holes as described above. Any process having greater mechanical load on the movable element can be conducted in this state after the first etching accordingly. A second etching only includes removing part of the residual portions of the sacrifice layer.

As described above, according to an electromechanical element and an electric circuit device of embodiments of the present invention, since holes are formed in the movable element, not only can the sacrifice layer be etched from a circumference of the movable element, but the sacrifice layer can also be etched through the holes formed in the movable element. As a result, the sacrifice layer can reliably and rapidly be removed by etching to form the movable element having a large area, such as large-scale surface MEMS having more than 100 μm on a side. Further, since the holes are arranged in the movable element according to the above-described positional manner, pillar shaped or a wall shaped support portions for the movable element can be formed in the process of etching the sacrifice layer. Thus, since mechanical strength of the movable element can be maintained and deformation of and damage to the movable element can be prevented during the fabrication steps, reliability can be improved and defective products can be decreased.

According to a method of fabricating an electromechanical element and an electric circuit device according to embodiments of the present invention, the main etching is conducted without removing support portions that can mechanically support the movable element in the first etching step as described above. Therefore, deformation of or damage to the movable element can be prevented; for example, deformation due to mechanical load or damage to on the movable element caused by forming electrodes on the movable element can be prevented. As a result, reliability and a yield rate can be improved.

The hollow formed by selecting arrangement of the aforementioned holes in the first etching cannot be intercepted with the sacrifice layer remained as mechanical support portions in the second etching. Thus, corroding electrodes or the like with an etchant due to elongation of immersion time can also be prevented in the second etching.

BRIEF DESCRIPTION OF THE DRAWINGS

FIGS. 1A and 1B are schematic sectional views of an electromechanical element 1 according to an embodiment of the present invention;

FIGS. 5A and 5B are outline sectional views showing one example of a required step according to a method of fabricating an embodiment of the present invention;

FIGS. 6A and 6B are outline sectional views showing one example of a required step according to a method of fabricating an embodiment of the present invention;

FIGS. 7A and 7B are outline sectional views showing one example of a required step according to a method of fabricating an embodiment of the present invention;

FIGS. 8A and 8B are outline sectional views showing one example of a required step according to a method of fabricating an embodiment of the present invention;

FIGS. 9A and 9B are outline sectional views showing one example of a required step according to a method of fabricating an embodiment of the present invention;

DESCRIPTION OF THE PREFERRED EMBODIMENTS

Figure 2:
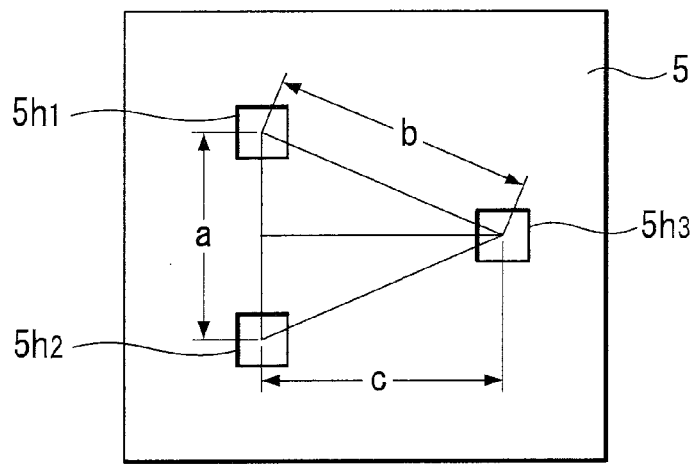
FIG. 2 is one example of a plan view showing a basic configuration of holes in a movable element of an electromechanical element according to an embodiment of the present invention.

Embodiments of an electromechanical element, an electric circuit device and a method of fabricating an electromechanical element and an electric circuit device are described with referring to drawings. However, the present invention is not limited to the embodiments.

FIGS. 1A and 1B are schematic sectional views of an electromechanical element 1 according to an embodiment of the present invention.

The electromechanical element 1 indicates a switch element including an electrostatic actuator that turns on or off using an electrostatic drive.

In the electromechanical element 1, specifically, in the electrostatic switch element, an insulating layer 3 is formed on a substrate 2, such as a crystal surface (100) forming a silicon semiconductor substrate surface, on which a fixed electrode 4 including an electrostatic actuator and a movable element 5 are formed, and the movable element 5, one end of which is fixed on the substrate 2 with an anchor 6 to form a cantilever model, and the electrode 4 are formed such that the movable element 5 moves close to or away from the electrode 4 using an electrostatic drive.

Further, first and second signal lines 7, 8 having respective fixed contacts 7a, 8a at the front ends are formed on the insulating layer 3.

A movable contact 5a is formed at an excessive end of the movable element 5 through an insulating layer 9.

On the other hand, the first and second signal lines 7, 8 having the respective fixed contacts 7a, 8a at front ends that turns on or off by the movable element 5 are formed on the insulating layer 3 of the substrate 2.

A wiring 10 is formed on a fixed side of the movable element 5 from the insulating layer 3 of the substrate 2, and a required electric charge is supplied to the movable element 5 through this wiring 10, thereby carrying out electrostatic push and pull operations between the movable element 5 and the fixed electrode 4. Consequently, the movable contact 5a moves between the fixed contacts 7a and 8a formed at the end of the first and second signal lines 7 and 8 to carry out the on-off operation by the movable element 5.

The insulating layer 3 may include a SiN (Silicon Nitride) layer with a thickness of 200 nm and $SiO_2$ (Silicon dioxide) layer with a thickness of 100 nm to form a laminated film, for example, and the insulating layer 9 may include SiN layer with a thickness of 100 nm.

In addition, the fixed electrode 4 may include P (phosphorous)-doped polycrystalline Si with a thickness of 150 nm, for example.

The movable contact 5a and fixed contact 8a may include Silicide thin film with a thickness of 100 nm.

The insulating film 9 includes a material for the sacrifice layer 23 described later, such as a SiN layer with a thickness of 100 nm that is corrosion-inhibiting against a $SiO_2$ etching solution.

Further, the anchor 6 may include an amorphous Si film with a thickness of 100 nm and the movable element may include the same amorphous Si layer with a thickness of 1000 nm.

The wiring 10 includes AlCu (Aluminum Copper) layer with a thickness of 500 nm, for example.

According to an embodiment of the present invention, a plurality of holes 5h, each having such as circled or squared-shape, are formed in the movable element 5.

FIG. 2 is a plan view showing a basic configuration of holes 5h in a movable element 5 of an electromechanical element according to an embodiment of the present invention.

In the holes 5h, a distance "a" between two holes 5h1 and 5h2 located in the same line and a distance "b" between one of the two holes 5h1 and 5h2 and a hole 5h3 located at the closest position from the one of the two holes 5h1 and 5h2 are arranged such that the distance "a" is shorter than the distance "b".

Figure 3:
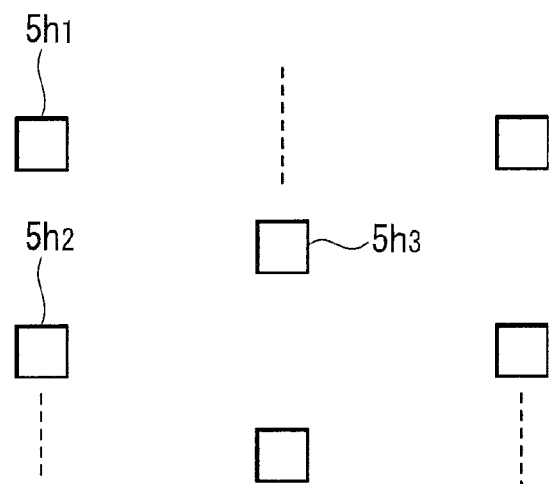
FIG. 3 is one example of a plan view showing a basic configuration of holes in a movable element of an electromechanical element according to an embodiment of the present invention.

FIG. 3 is a plan view showing a plurality of combination holes 5h as a basic configuration of holes 5h1 to 5h3 of a movable element according to an embodiment of the present invention.

Examples in FIGS. 2 and 3 show examples showing an arrangement of the three holes as a combination. In the examples, the hole 5h of the combination holes can be arranged such that the 5h is located at a vertex of an isosceles triangle.

Figure 4:
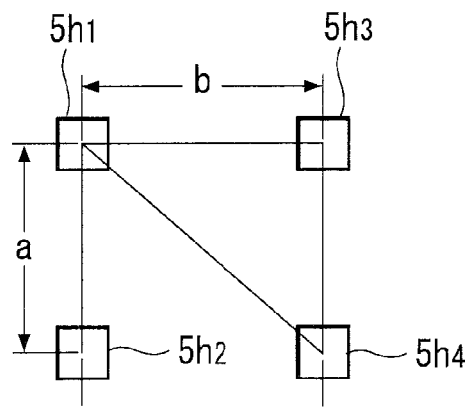
FIG. 4 is one example of a plan view showing a basic configuration of holes in a movable element of an electromechanical element according to an embodiment of the present invention.
Figure 10:
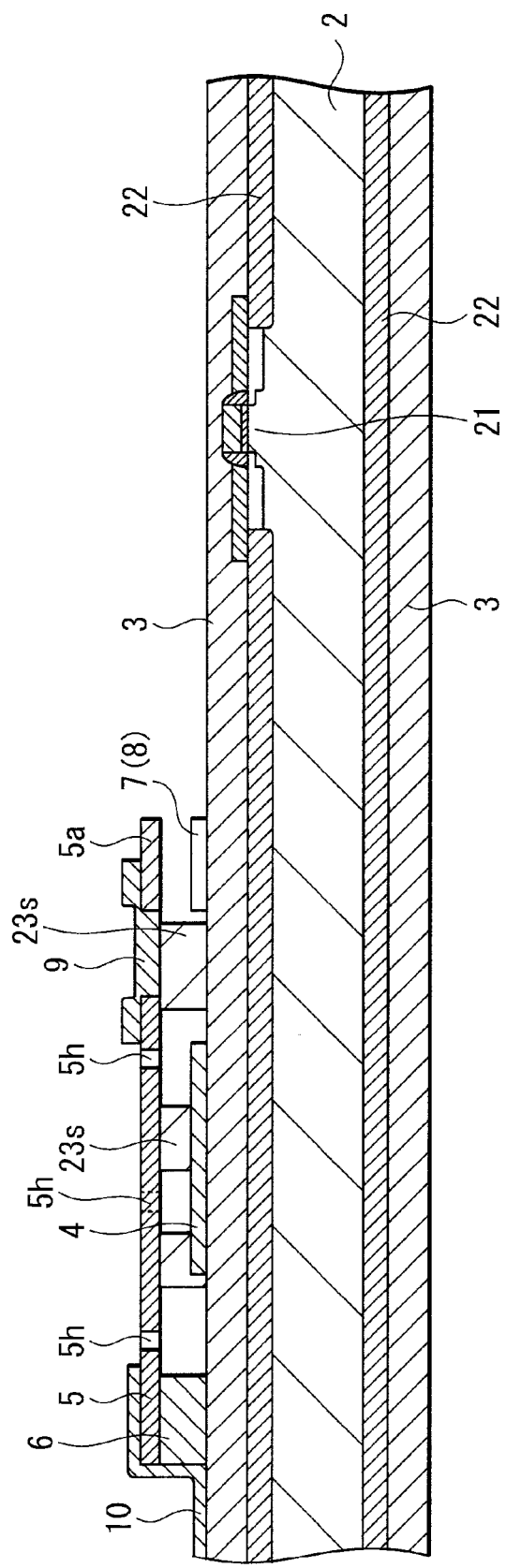
FIG. 10 is an outline sectional view showing one example of a required step according to a method of fabricating an embodiment of the present invention.

FIG. 4 is a plan view showing another example of configuration of holes 5h of a movable element 5 according to an embodiment of the present invention.

In this example, the holes are arranged such that the distance "a" is shorter than the distance "b" as described above; however, the configuration of the combination holes form a right angled triangle instead of an isosceles triangle.

A width of the squared holes 5h or an inner diameter of the circled holes 5h may be selected to have approximately 5 μm to 10 μm, and the distance "a" may be selected to have approximately 10 μm to 20 μm, and the distance "b" may be selected to have approximately 15 μm to 35 μm. A size of the hole 5h and the distance between the holes 5h arranged are selected depending on rigidity required for a movable element finally formed as an actuator; however, the distance is selected to be as short the distance between the holes 5h as the rigidity allows. The size of the hole 5h is selected as small as possible in accordance with the viscosity of a chemical solution.

Next, a method of fabricating an electromechanical element according to an embodiment of the present invention is described accompanying a method of fabricating an electric circuit according to an embodiment of the present invention that includes this electromechanical element.

FIGS. 5 to 10 are outline sectional views showing some steps of a method of fabricating an embodiment of the present invention; and FIGS. 11 to 16 are outline plan views showing the steps of the method of fabricating the embodiment of the present invention that are useful to illustrate the outline sectional views. The same numerals corresponding to portions of FIG. 1 are given to the portions of the FIGS. 5 to 16.

In the embodiment, as is shown in FIG. 5A, another electric circuit element 21 or the like that configures an electric circuit device is formed on one of the main surfaces of a substrate 2 formed of a silicon semiconductor substrate by an ordinary method. A portion on which an insulated gate MOSFET (Metal Oxide Semiconductor Field Effect Transistor) formed is shown as a representative of the electric circuit element 21 in the drawing.

For example, surface insulating layers 22 are formed on both surfaces of the silicon semiconductor substrate of the substrate 2 by surface thermal oxidation, on which an insulating layer 3 formed of SiN with a thickness of 300 nm is formed by CVD (Chemical Vapor Deposition) on the surfaces.

An anchor 6 that supports a movable element of an electromechanical element described in FIG. 1 is formed on the insulating layer 3 on which the electromechanical element is formed as a target of the substrate 2. The anchor 6 may be formed by having a high resistance polycrystalline Si layer or SiN layer with undoped impurities once formed on the entire surface of the insulating layer 3 by CVD, and then having the high resistance polycrystalline Si or SiN layer pattern-etched in a limited extent at predetermined position by the lithography.

Figure 11:
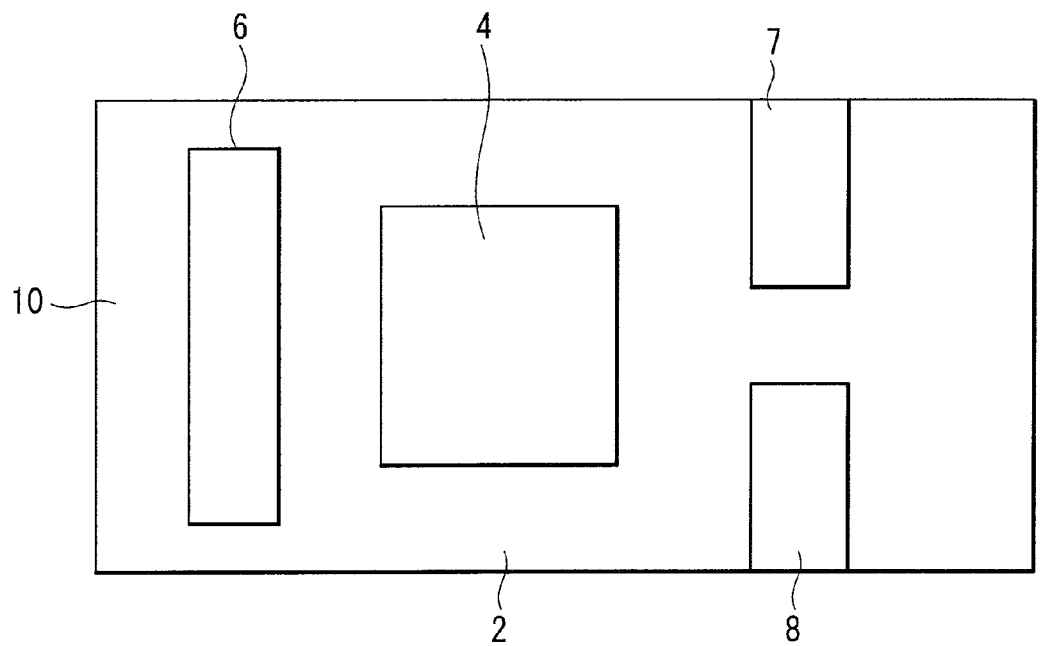
FIG. 11 is an outline plan view showing one example of a required step according to a method of fabricating an embodiment of the present invention.

As is shown in FIGS. 5B and 11, a fixed electrode 4 and wiring of first and second signal lines 7, 8 that are arranged to face a movable element described in FIG. 1 are formed on the insulating layer 3. For example, the wiring is formed by forming an impurities-doped polycrystalline Si layer or metal layer on an entire surface by the sputtering or the like, and then is patterned by lithography.

A sacrifice layer 23 may include $Sio_2$, for example. The a insulating layer 9 may be formed of SiN that has excellent selectability for etching and that is not corroded or difficult to be corroded by a fluoride acid solution used for the sacrifice layer 23 as the etching solution.

As is shown in FIG. 6A, the sacrifice layer 23 is formed to cover an anchor 6, a fixed electrode 4 and wiring of first and second signal lines 7, 8 or the like. The sacrifice layer 23 is formed on an entire surface (not shown), and then planarized by performing etchback by CMP (Chemical Mechanical Polish) until an upper end of the anchor 6 is exposed.

Figure 12:
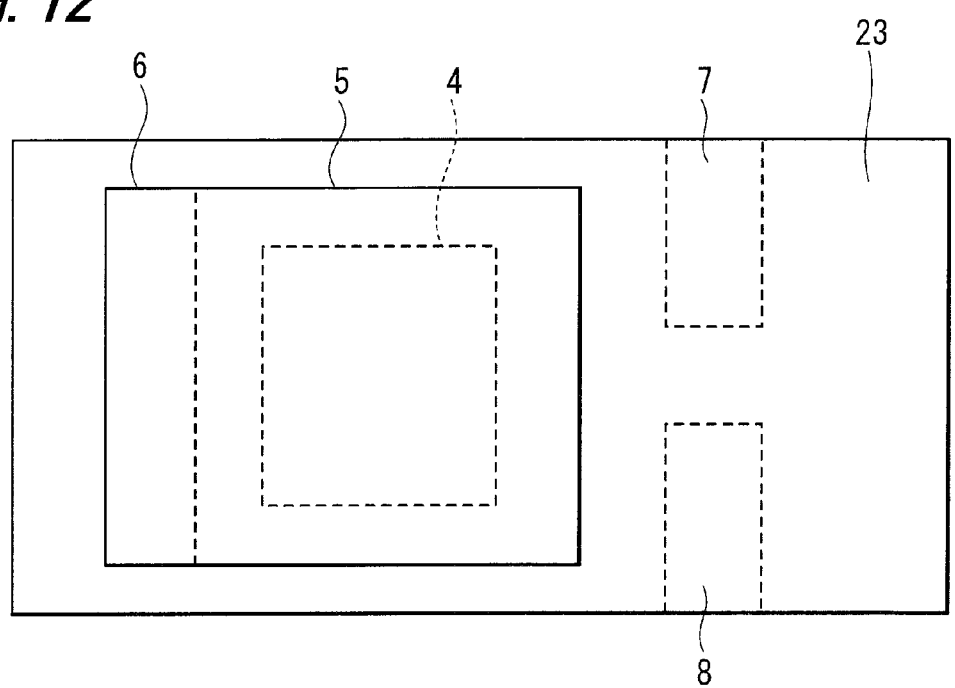
FIG. 12 is an outline plan view of a flow chart showing one example a method of fabricating an embodiment of the present invention.

As is shown in FIGS. 6B and 12, a movable element 5 is formed on the planarized surface of the sacrifice layer 23 such that the movable element 5 extended from an upper end surface of the anchor 6 to the vicinity of the front end of signal lines 7, 8 are not interfere with an arrangement portion of the fixed electrode 4. The movable element 5 may have an impurities-doped polycrystalline Si layer with conductivity formed once on the entire surface, and then form the above-described required pattern by photolithography.

Figure 13:
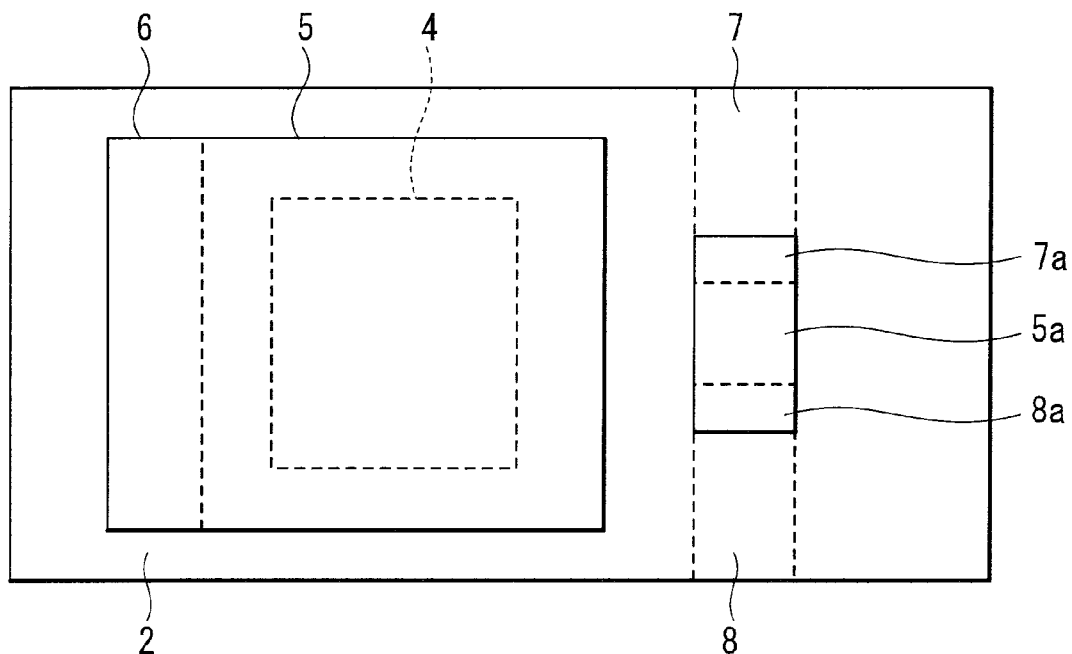
FIG. 13 is an outline plan view of a flow chart showing one example a method of fabricating an embodiment of the present invention.

As is shown in FIGS. 7A and 13, a movable contact 5a formed of Au alloys or Silicide described in FIG. 1 is formed on the sacrifice layer 23 such that the movable contact 5a is interposed between the contacts 7a and 8a locate at respective front ends of the first and second signal lines 7, 8 that are faced each other. The sacrifice layer 23 is etched by isotropic etching.

Figure 14:
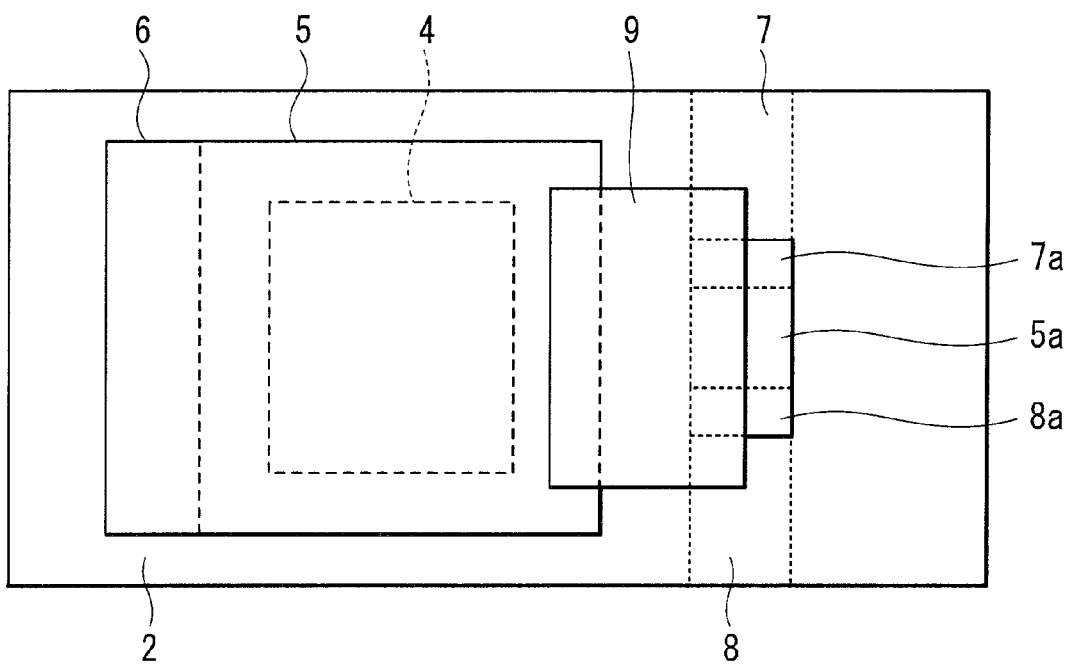
FIG. 14 is an outline plan view of a flow chart showing one example a method of fabricating an embodiment of the present invention.

As shown in FIGS. 7B and 14, an insulating layer 9 is formed on a front end of the movable element 5 and a movable contact 5a via the insulating layer 9 such that an excessive end of the movable element 5 and the movable contact 5a are mechanically connected.

For example, the insulating layer 9 is once formed on an entire surface, which is then performed patterning by photolithography.

Figure 15:
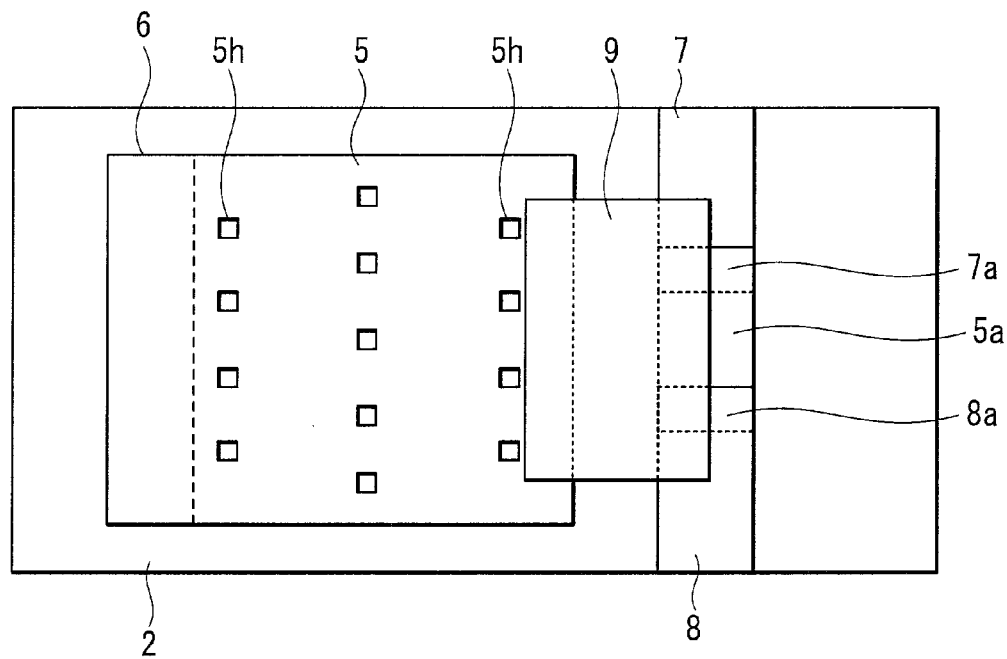
FIG. 15 is an outline plan view of a flow chart showing one example a method of fabricating an embodiment of the present invention.

As shown in FIGS. 8A and 15, a plurality of holes 5h are formed in the movable element 5 by the photolithography. The first etching is then performed subsequently. The etching is performed from portions where the sacrifice layer around the holes 5h and movable element 5 are exposed outside by wet-etching using a high concentration etching solution, such as a fluoric acid. The sacrifice layer 23 is etched by isotropic etching.

Thus, as shown in FIG. 8B, the hollowed portions 23h are formed by removing the sacrifice layer using a face-directional etching which begins with the peripheral portion of the movable element 5 and the holes 5h, and proceeds into under the peripheral portion of the movable element 5 and under limbs of the holes 5h; while etching is not performed between the hollowed portions 23h, and residual portions of the sacrifice layer remains forming support portions 23s that support the movable element 5 having a pillar shape or a wall shape.

As is shown in FIG. 9A, an aluminum wiring layer 24 forming the wiring 10 that supplies power to the movable element 5 shown in FIG. 1 is formed on an entire surface by sputtering or the like.

Figure 16:
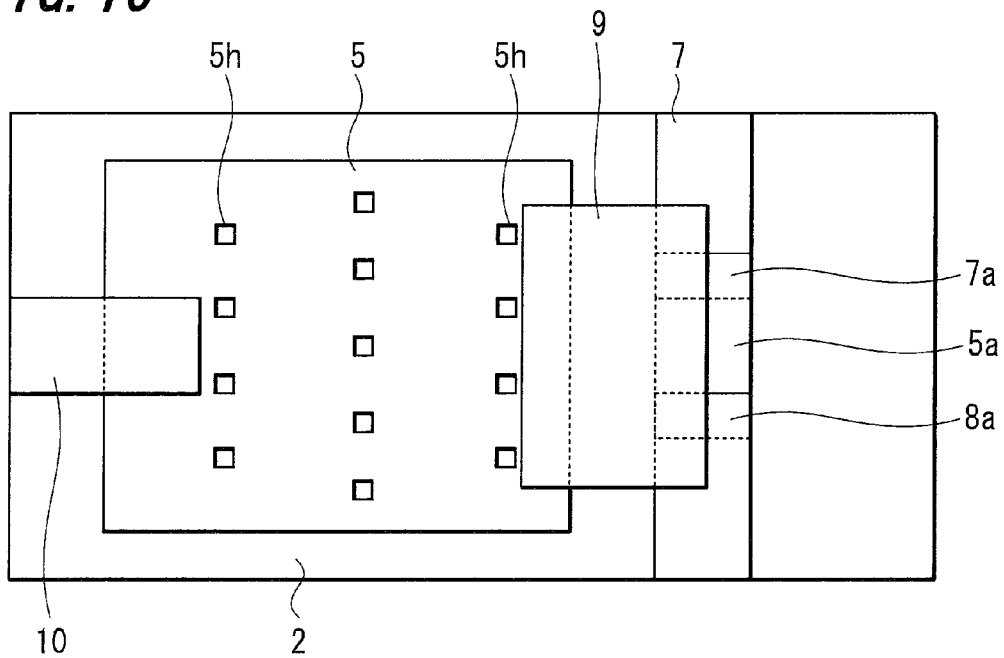
FIG. 16 is an outline plan view of a flow chart showing one example a method of fabricating an embodiment of the present invention.

Then, as shown in FIGS. 9B and 16, wiring layer 24 is etched with a required pattern to form the wiring 10.

The wiring 10 may be formed by patterned etching using photolithography. As shown in FIG. 9A, a photoresist 25 is formed on the portion where the wiring 10 of the wiring layer 24 is formed. The photoresist 25 may be formed by entire surface coating, pattern exposure and development. Then, the photoresist 25 is removed by wetetching using the Al wiring layer 24 as a mask that does not substantially corrode the movable element 5, insulating layers 9 and 3 or the like, thereby forming the wiring 10 having the required pattern.

A comparatively large weight due to such as formation of the photoresist 25 and a mechanical load such as a pressure during the coating is imposed on the movable element 5. However, according to a method of fabricating an embodiment of the present invention, since the aforementioned support portions 23s remains under the movable element 5, deformation of or damage to the movable element 5 may be prevented.

It should be noted that in the formation of the above wiring 10, the Al wiring layer 24, is accumulated in the inner limbs of the holes 5h and on the insulating layer 3 through the holes 5h during sputtering of the wiring layer 24 such as Al layer on the entire surface; however, the amount of deposition are very small, therefore the deposition may be removed during the wet-etching used for the patterning that forms the above wiring 10.

An electric circuit device 30 according to an embodiment of the present invention is fabricated by the following steps:

forming a movable contact 5a at the front end of the substrate 2 where the circuit element 21 is formed;

forming a cantilevered movable element 5, one end of which the movable contact 5a is supported by an anchor 6; and forming an electromechanical element 1 that performs on or off operation between the fixed contacts 7a and 8a of the first and second signal lines 7, 8 by the push or pull operation using electrostatic force between the movable element 5 and the fixed electrode 4, for example.

As is mentioned above, according to an embodiment of the the present invention, the first and second etching steps are performed. In the first etching step, most of the sacrifice layer 23 may be removed with fluoride acid. In the second etching step, the second etching can be carried out on residual portions of the sacrifice layer using a comparatively light-etching with buffered fluoride acid in comparatively short time.

As mentioned above, according to an embodiment of the present invention, first etching step, the removal of the sacrifice layer 23 is performed by etching proceeded from the outer edge of a movable portion other than a fixed portion with the anchor 6 of the movable element 5 and by etching proceeded from the holes 5h; however, the first etching is stopped when portions of the sacrifice layer 23 remain unetched to form the support portions 23s having a pillar shape or a wall shape.

In this case, if the support portions 23s formed by the residual sacrifice layer 23 encloses some of the hollows 23h, and the path of the etching solution is blocked against the circumference of the movable element to form a closed pattern the liquid pool of the etching solution occurs in this portion and the etching solution can only be supplied to the holes 5h. Thus, since the etching solution is comparatively decreased, etching progress is drastically lowered. As a result, in the second etching step, the sacrifice layer cannot be removed completely or the electrode or the like may be corroded due to elongation of the etching time.

According to an embodiment of the present invention, the shape of the support portions 23s may form a closed pattern to prevent occurrence of the liquid pool. As described in FIGS. 2 to 4, the occurrence of liquid pool is prevented by arranging the holes 5h such that the relationship between a distance "a" between two holes 5h1 and 5h2 adjacently arranged in the same line is shorter than a distance "b" between one of the two holes 5h1, 5h2 and one hole 5h3 arranged in another line having the closest position from one of the two holes 5h1, 5h2. The three holes correspond to respective vertices of an isosceles triangle or a right angled triangle.

The following describes details of the above.

FIGS. 17 to 20 are schematic sectional views showing the following configuration. A plurality of holes 5h in each movable element 5 are arranged in respective lines with a predetermined interval "a". Specifically, two holes 5h in one line arranged with a predetermined interval "a" and one hole 5h in another line located adjacent to the line with the same interval "a" are arranged with a distance of "a"/2 shifted in the row-direction, and the both lines with respective holes are alternately arranged. In this configuration, the two holes 5h adjacently arranged in the same line and the one hole 5h located between the two hole in the other line are arranged such that the two holes in the same line and the one hole in the other line respectively correspond to vertices of an isosceles triangle. More specifically, a basic configuration of holes in the two lines alternately arranged in FIGS. 17 to 20 shows the basic configuration in the reverse direction in FIG. 2.

Figure 17:
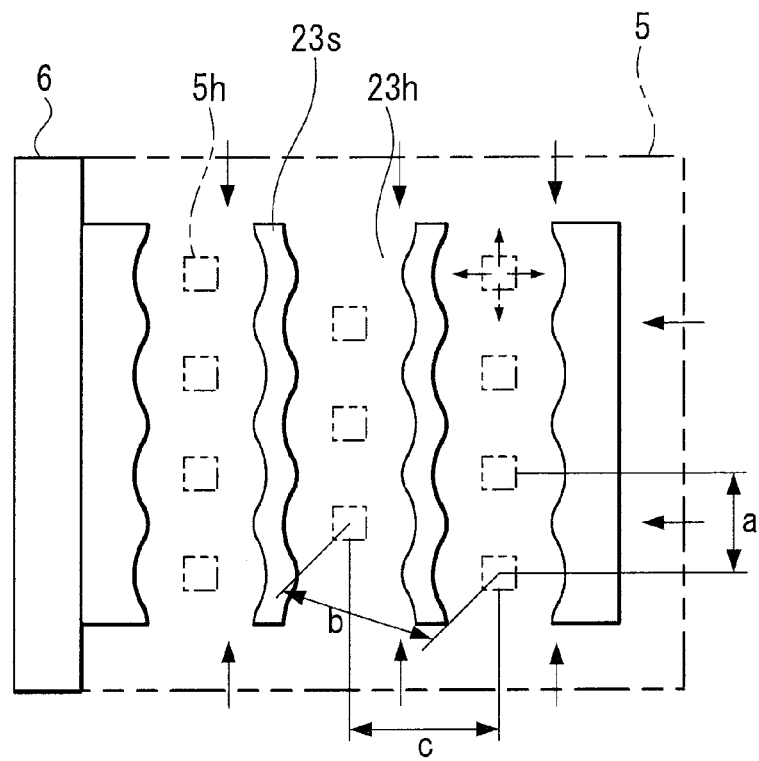
FIG. 17 is an schematic plan view showing a relationship between holes in a movable element and an etching pattern in a flow chart showing one example of a method of fabricating an embodiment of the present invention.

FIG. 17 shows the above-mentioned cantilevered configuration in which a movable element 5 is supported by an anchor 6 at one side, and the aforementioned row-direction of the holes 5h of the movable element 5 indicates the direction along the side where the anchor is arranged.

Figure 18:
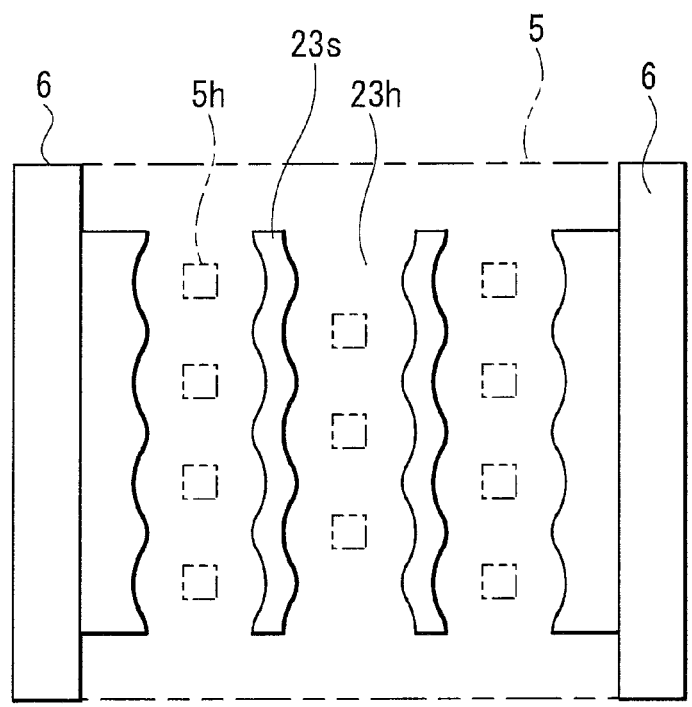
FIG. 18 is an schematic plan view showing a relationship between holes in a movable element and an etching pattern in a flow chart showing one example of a method of fabricating an embodiment of the present invention.
Figure 19:
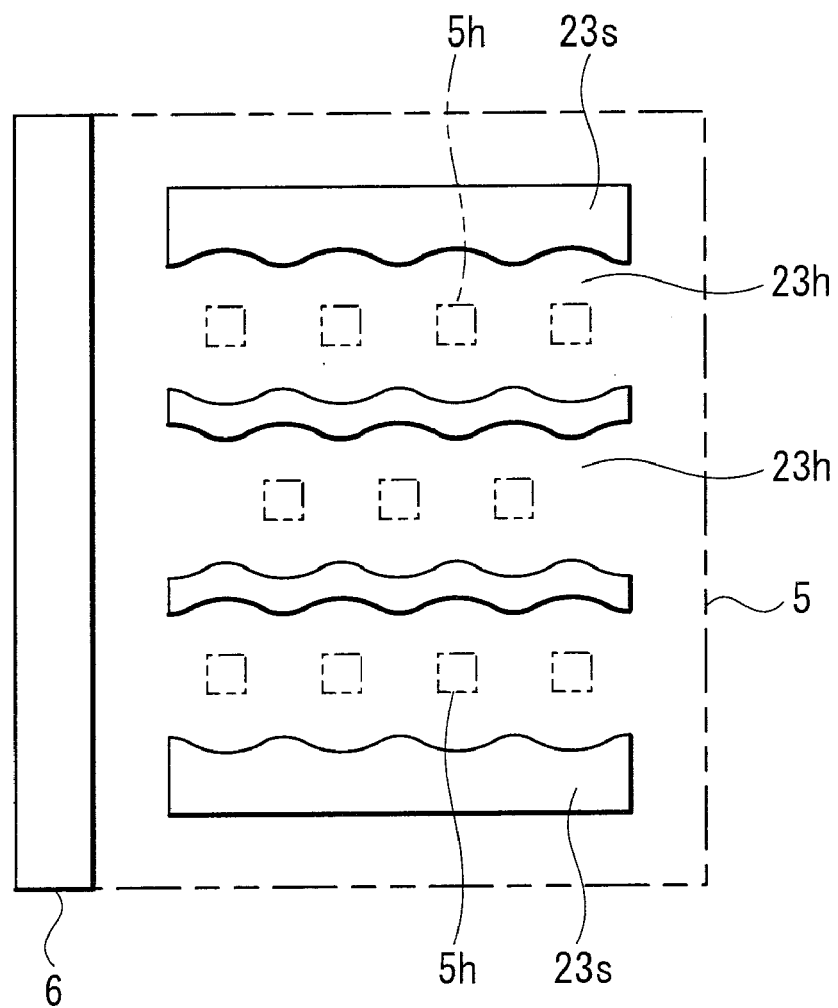
FIG. 19 is an schematic plan view showing a relationship between holes in a movable element and an etching pattern in a flow chart showing one example of a method of fabricating an embodiment of the present invention.

In addition, in an embodiment shown in FIG. 18, two anchors 6 are arranged at two sides of the movable element that are faced to each other, and further, in an embodiment shown in FIG. 19, anchors 6 are arranged at three sides of the movable element.

Specifically, an etchant cannot be entered from circumferences of the portions where the anchors 6 are arranged, an anchor 6 is not arranged on at least one portion of at least one side of the movable element 5.

Figure 20:
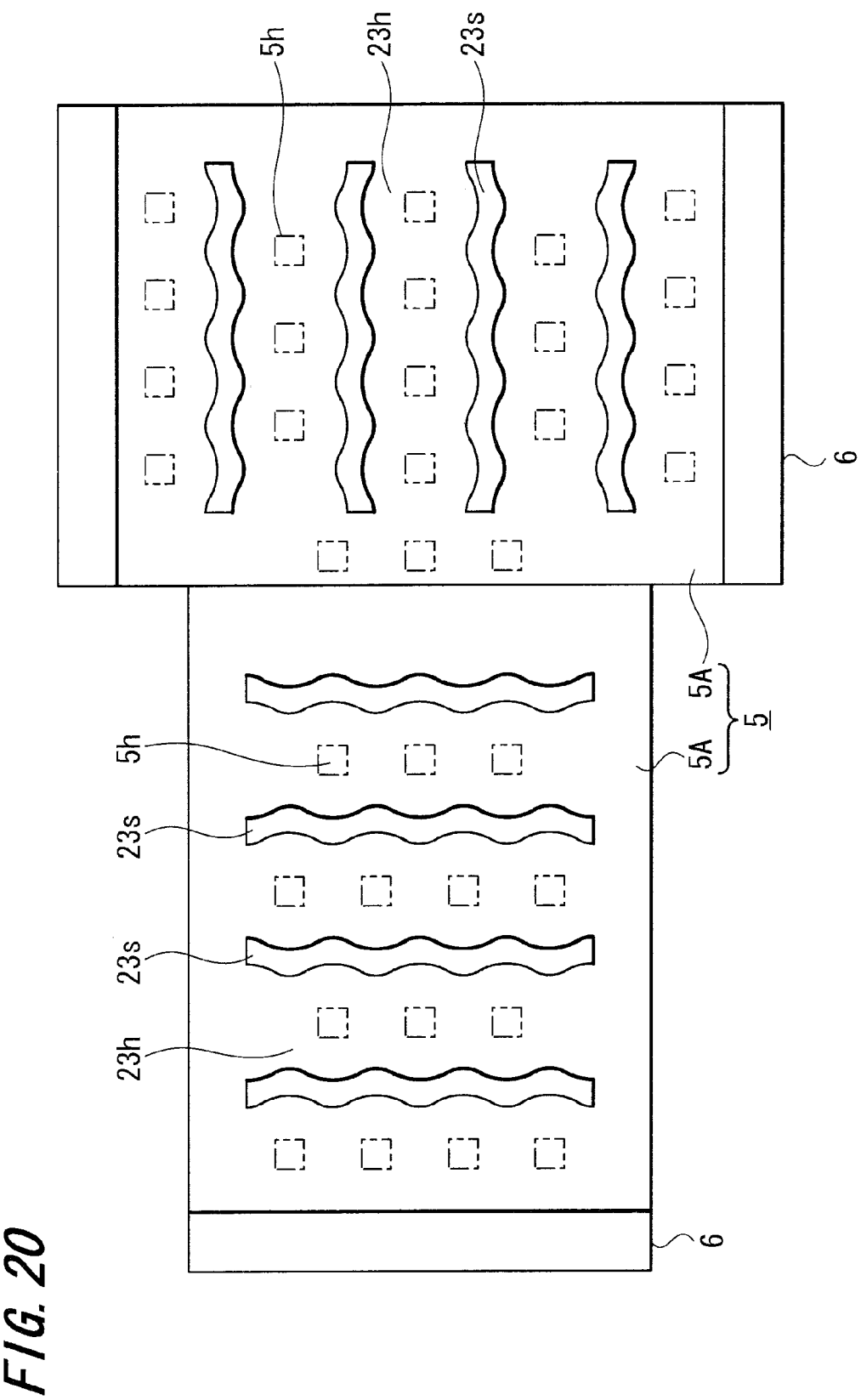
FIG. 20 is an schematic plan view showing a relationship between holes in a movable element and an etching pattern in a flow chart showing one example of a method of fabricating an embodiment of the present invention.

Further, FIG. 20 shows two types movable elements 5A and 5B having different shapes. This indicates a combination of two types of the movable elements, namely, an electromagnetic type and an electrostatic type.

Etching of the sacrifice layer 23 formed under the movable element 5 is performed by etching from holes 5h and by the etching from the open side of the movable element 5 where the anchor 6 is not arranged; however, etching from centers of the holes 5h is circularly proceeded in the isotropic direction, thereby forming a hollowed portion 23h around each hole 5h.

In this case, when the first etching is stopped after a predetermined time is elapsed by selecting a distance "a" between the holes 5h adjacently arranged in the same line, a distance "c" between the adjacent two lines and a distance "b" between two holes 5h arranged in adjacent lines and selecting etching condition or the like, etching is circularly proceeded from centers of the holes 5h arranged in the same line in the isotropic direction, and the portions of the hollowed portion 23h are merged to form a communication hollowed portion 23h.

Then, at least one end of the communication hollowed portion 23h is arranged such that the end is communicated outside at the side where an anchor 6 of the movable element 5 is not arranged.

For example, both ends of the communication hollowed portion 23h can directly communicate outside as shown in FIG. 17.

Then, support portions 23s formed of walls by using the residual portion of the sacrifice layer 23 are provided between those connected hollowed portions 23h formed in the row-direction as a main extended direction.

Thus, the support portions 23s having a wall shape are formed by using the residual portion of the sacrifice layer 23 located under the movable element 5, the movable element 5 is firmly reinforced in comparison with the support portions 23s having a pillar shape, for example.

The hollowed portions 23h formed in the etching step may directly be opened to the side of the movable element 5, or formation of closed portions can be prevented by forming the hollowed portions during etching from a circumference of the movable element 5, thereby preventing occurrence of a liquid pool.

In an embodiment of FIG. 20, both ends of the communication hollowed portions 23h include the anchors 6; however, an etchant can be entered and etching is proceeded by having at least one side of the movable element 5 opened. Accordingly, one end of the communication hollowed portion 23h can directly be opened outside of the movable element 5, or can be opened outside by communication with etching portions proceeded from the open side of the movable element 5.

According to an embodiment of the present invention, formation of etching pools in etching sacrifice layer can be prevented by forming a plurality of holes 5h with a specific arrangement in the movable element 5.

FIGS. 21A, 21B and 22A, 22B are schematic plan views showing arrangements of holes 5h in the movable element 5 that do not refer to the embodiments of the present invention.

Figure 21A:
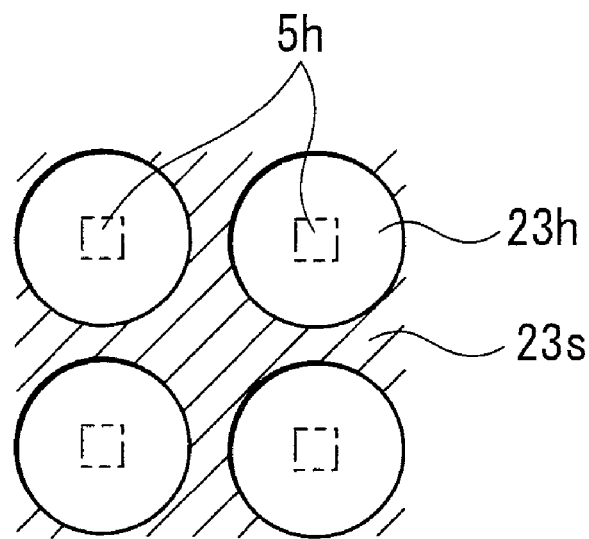
FIGS. 21A and 21B are schematic plan views showing an arrangement of holes in relation to support-portions formed of residual portions of sacrifice-layer for comparison with reference to am embodiment of the present invention.
Figure 21B:
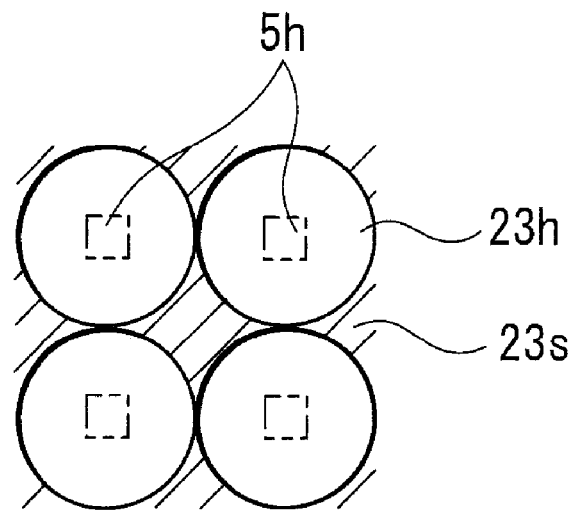
Figure 22A:
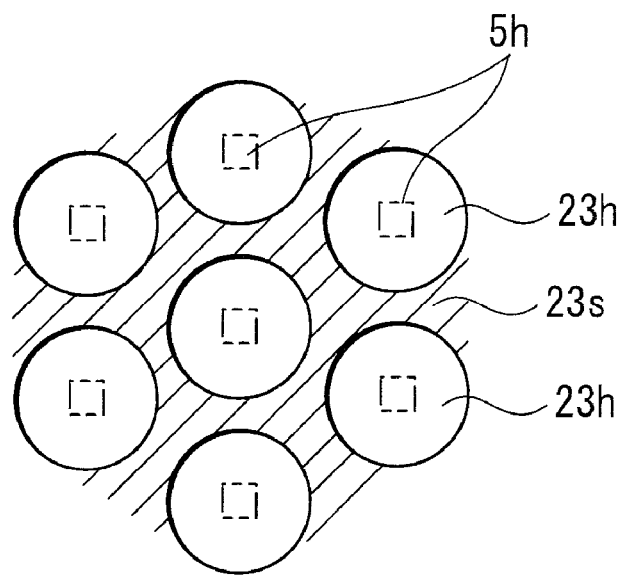
FIGS. 22A and 22B are schematic plan views showing an arrangement of holes in relation to support-portions formed of residual portions of sacrifice-layer for comparison with reference to am embodiment of the present invention.
Figure 22B:
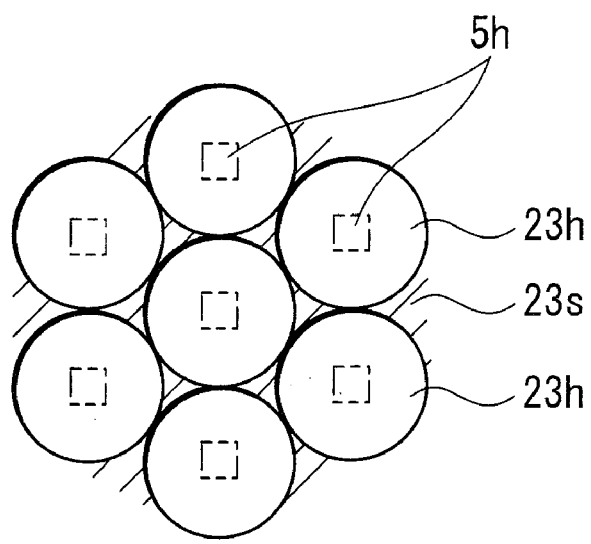

Specifically, FIGS. 21A, 21B and 22A, 22B show the residual portions of the sacrifice layer 23 or patterns of the support portions 23s formed in the first etching when the equation "a=b" is applied to distances "a" and "b" between the adjacently arranged holes. FIGS. 21A and 21B show configurations in which the holes 5h are arranged at respective corners of a square, and FIGS. 22A and 22B show configurations in which the holes 5h are arranged in a staggered arrangement. If the support portions 23s are formed with a wall shape, the hollows 23h formed through the holes 5h are independently separated by the support portions 23s, thereby forming liquid pools as is shown in FIGS. 21A and 22A. Or, as shown in FIGS. 21B and 22B, if the support portions 23s fare formed with a pillar shape, since the adjacent hollowed portions 23h can merely be communicated through small regions of point-contacts or line-contacts, the liquid pool is substantially formed.

According to a configuration and a method of the embodiments of the present invention, the drawbacks of this kind may be prevented.

According to an electromechanical element, an electric circuit device and a method of fabricating an electromechanical element and an electric circuit device of an embodiment of the present invention, a plurality of holes 5h are arranged in the movable element with a specific arrangement pattern. According to the fabrication, the sacrifice layer can be removed with support portions, that is, any process having greater mechanical load on the movable element can be conducted with support portions in the first and second etchings. For example, in the fabrication of a large-scale movable element, since deformation of and damage to the movable element can be prevented during the fabrication steps, reliability can be improved and a yield rate can be improved.

The formation of etching pools can be prevented in forming support portions of the sacrifice layer, etching of the sacrifice layer can efficiently conducted. Further, etching can be conducted using a low etch rate etchant in a short period of time, corroding electrodes or the like with an etchant in the second etching can efficiently be prevented.

It should be noted that the embodiments shown in the drawings are the cases in which the holes that are penetrated to form in the movable element 5 are a square shape; however, the shapes of the holes are not limited to a square shape. The holes may be a polygon such as a circle, triangle or the like. without limiting it to this shape. In practice, when the sacrifice layer 23 is etched through the penetrated holes, there is no effect on the removal of the sacrifice layer 23, and hence formation of the holes can be easier for masking in the photolithographic step when using a polygon shape such as a square shape.

In addition, it is apparent that an electromechanical element, electric circuit and a method of fabricating the electromechanical element and the electric circuit according to the embodiments of the present invention are not limited to the configuration including a movable element, and various movable elements can be applied to an electromechanical element and electric circuit and a method of fabricating the electromechanical element and the electric circuit. It should be understood by those skilled in the art that various modifications, combinations, sub-combinations and alterations may occur depending on design requirements and other factors insofar as they are within the scope of the appended claims or the equivalents thereof.

What is claimed is:

1. A method of fabricating an electromechanical element including a mechanically movable element movable in a hollow formed on a substrate, comprising the steps of:
   forming a movable element on a sacrifice layer;
   penetrating the movable element to form a plurality of holes in the movable element through which the sacrifice layer is exposed;
   performing a first etching step on the sacrifice layer; and
   performing a second etching step on the sacrifice layer,
   wherein,
      the first etching step includes removing the sacrifice layer from a circumference of the movable element and the holes in the movable element to form support portions for the movable element using residual portions of the sacrifice layer,
      a mechanical load is imposed on the movable element after the first etching step and before the second etching step,
      the second etching step includes removing the residual portions of the sacrifice layer located under the movable element such that the movable element is movable,
      the plurality of holes are arranged such that at least first and second holes are successively located along a first line and are separated by a first distance,
      at least a third hole is located along a second line which is adjacent to the first line,
      the first and third holes are located closer to each other than are the second and third holes and are separated by a second distance, and
      the first distance is shorter than the second distance.

2. The method of fabricating an electromechanical element according to claim 1, wherein the first, second and third holes correspond to vertices of an isosceles triangle or a right angle triangle.

3. The method of fabricating an electromechanical element according to claim 1, wherein the support portions include wall shapes.

4. The method of fabricating an electromechanical element according to claim 1, wherein an etch rate of the first etching step is faster than an etch rate of the second etching step.

5. The method of fabricating an electromechanical element according to claim 1, wherein the first etching step includes removing the sacrifice layer to form a hollow portion that communicates with the outer circumference of the movable element without being intercepted by the support portions.

6. A method of fabricating an electric circuit device, comprising the steps of:
   forming a movable element on a sacrifice layer, the movable element movable in a hollow formed on a substrate;
   penetrating to the movable element to form a plurality of holes in the movable element through which the sacrifice layer is exposed;
   performing a first etching step on the sacrifice layer; and
   performing a second etching step on the sacrifice layer,
   wherein,
      the plurality of holes are arranged such that at least first and second holes are successively located along a first line and are separated by a first distance,
      at least a third hole is located along a second line which is adjacent to the first line,
      the first and third holes are located closer to each other than are the second and third holes and are separated by a second distance,
      the first distance is shorter than the second distance the first etching step includes removing the sacrifice layer from a circumference of the movable element and the holes in the movable element to form support portions for the movable element in a pillar shape or a wall shape using residual portions of the sacrifice layer, a mechanical load is imposed on the movable element after the first etching step and before the second etching step, and the second etching step includes removing the residual portions of the sacrifice layer located under the movable element such that the movable element is movable.

7. The method of fabricating an electric circuit device according to claim 6, wherein the first, second and third holes correspond to vertices of an isosceles triangle or a right angle triangle.

8. The method of fabricating an electric circuit device according to claim 6, wherein the support portions include wall shapes.

9. The method of fabricating an electric circuit device according to claim 6, wherein an etch rate of the first etching step is faster than an etch rate of the second etching step.

10. The method of fabricating an electric circuit device according to claim 6, wherein the first etching step includes removing the sacrifice layer to form a hollow portion that communicates with the outer circumference of the movable element without being intercepted by the support portions.

* * * * *